US008183085B2

(12) United States Patent
Bar-sadeh et al.

(10) Patent No.: US 8,183,085 B2
(45) Date of Patent: May 22, 2012

(54) HIGH RATE SELECTIVE POLYMER GROWTH ON A SUBSTRATE

(75) Inventors: Eyal Bar-sadeh, Jerusalem (IL); Nuriel Amir, Doar Na Shikmim (IL); Alexander Ripp, Beer Sheva (IL); Yakov Shor, Beer Sheva (IL); Dror Horvitz, Bear Tuvia (IL)

(73) Assignee: Micron Technology, Inc., Boise, ID (US)

( * ) Notice: Subject to any disclaimer, the term of this patent is extended or adjusted under 35 U.S.C. 154(b) by 455 days.

(21) Appl. No.: 12/416,094

(22) Filed: Mar. 31, 2009

(65) Prior Publication Data
US 2010/0243306 A1    Sep. 30, 2010

(51) Int. Cl.
*H01L 51/40* (2006.01)

(52) U.S. Cl. ............ 438/99; 257/40; 427/299; 427/327

(58) Field of Classification Search ............ 438/99; 257/40; 427/299, 327
See application file for complete search history.

(56) References Cited

U.S. PATENT DOCUMENTS
7,384,815 B2 *   6/2008   Tour et al. .............. 438/99

* cited by examiner

*Primary Examiner* — Matthew Landau
*Assistant Examiner* — Colleen E Snow
(74) *Attorney, Agent, or Firm* — Dana LeMoine; LeMoine Patent Services, PLLC

(57) ABSTRACT

Method and systems provide growth of polymer structures at a high rate in a selective manner. In various embodiments, the method or system can expose the growth site to a polymer source and growing a polymer tube at a rate of at least 80 micrometer per hour at the growth site. The method or system can provide selectivity by providing a growth site on a substrate by patterning a metal, such as copper, that provides a seed site for the polymer. Non-selected sites can be coated with a polymer growth inhibitor, such as polyimide or silicon nitride.

15 Claims, 7 Drawing Sheets
(2 of 7 Drawing Sheet(s) Filed in Color)

HIGH RATE SELECTIVE POLYMER GROWTH ON A SUBSTRATE

FIELD

The present invention relates generally to methods and structures to form polymer structures on substrates, and more specifically to integrated circuit fabrication.

BACKGROUND

Growth of polymers for use in integrated circuit fabrication requires selective growth at a sufficient rate to be economically feasible for fabrication.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
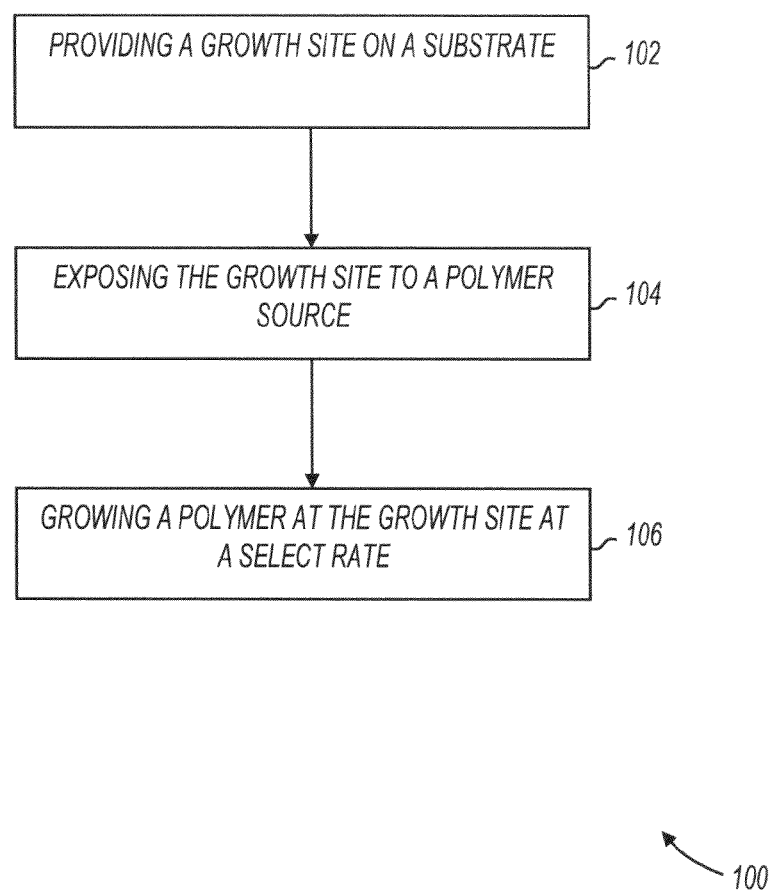
FIG. 1 shows a flow chart of a method according to various embodiments of the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DESCRIPTION OF EMBODIMENTS

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

FIG. 1 shows a method 100 for fabrication of polymer structures on a substrate. The polymer structures are for use in integrated circuits and, in an example, are fabricated at a fast rate and at a micrometer or nanometer scale. The polymer structure can be a vertical tower or a tubular structure. The polymer structure can be used as an insulator in a circuit. Another use of the polymer structure is a spacer or thermal conductor to provide cooling within the circuit. The polymer structure can further act as an electrical conductor.

At 102, a growth site is provided on a substrate. The growth site is the position whereat the polymer structure is grown. In an example, the growth sites are created by patterning the substrate to expose the growth sites. The growth sites can be a partially exposed layer that is mostly covered by a patterned layer that inhibits or outright prevents growth of the polymer structure. In an example, the exposed layer is a metal layer. In an example, the layer covering the metal layer is a polyimide or silicon-nitride layer.

At 104, the growth site is exposed to a polymer source. The polymer components leave the polymer source and enter a deposition chamber wherein the substrate with the growth sites is positioned. In an example, the polymer source can be a binder tape containing polymer adhesive on a backing. The polymer adhesive contains chemical elements that produce polymer. In an example, no additional, external forces are applied to the polymer source or the growth site. In an example, the polymer source need only be physically close to the growth site and the components of the polymer source are outgassed. The physical closeness of the polymer source allows the outgassed components to arrive and deposit at the growth site.

At 106, a polymer structure is grown at the growth site at a rate of at least 80 micrometer per hour. The polymer structure can be a tubular structure that extends upwardly from the upper surface of the substrate. In an example, the polymer structure is grown via a condensation reaction. In an example, a solid source of the polymer is positioned in the deposition chamber and the polymer enters the volume of the deposition chamber with some of the air-borne polymer depositing at the growth site and then additional polymer material grows on the previously deposited polymer to grow the polymer structure. The mask layer on the substrate prevents the polymer from adhering to the substrate at non-growth sites.

Figure 2:
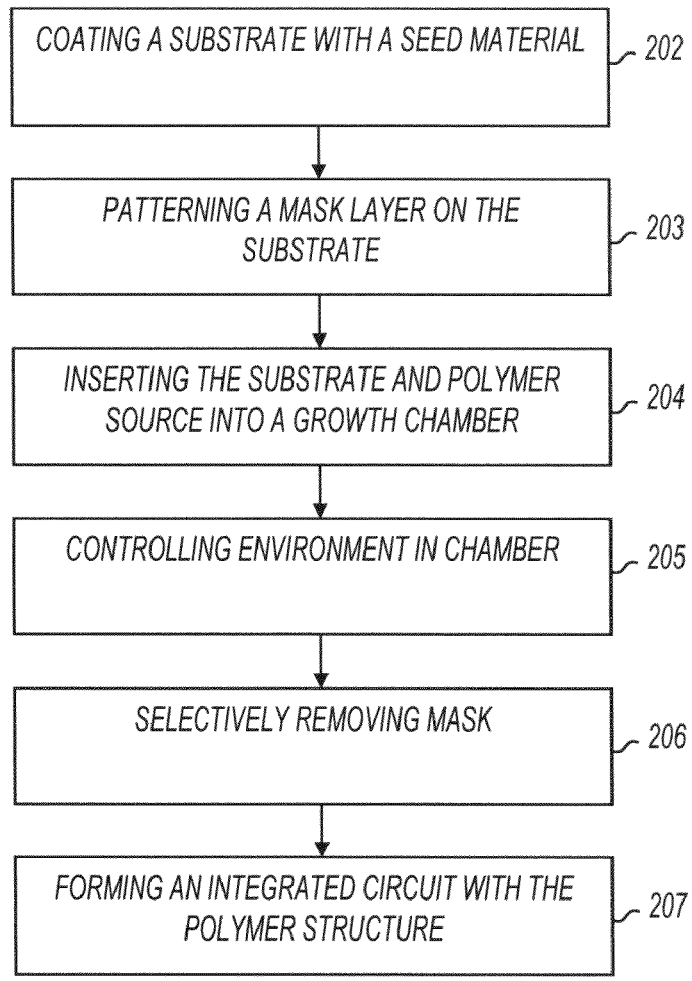
FIG. 2 shows a flow chart of a method in accordance with various embodiments of the present invention.

FIG. 2 shows a method 200 for fabrication of polymer structures on a substrate. At 202, the substrate is coated with a seed material. In an example, the seed material is a metal. In an example, the metal material is copper. The seed material provides a location that attracts the polymer material to grow on the substrate. The seed material can completely cover a substrate such as a wafer. In an example, the seed layer is patterned on the substrate.

At 203, a mask layer is positioned on the substrate and covers areas of the substrate at which the polymer should not be grown. The mask layer can be a polyimide. In an example, the mask layer includes silicon-nitride. The mask layer can be deposited then patterned using lithography. Portions of the mask layer that cover the growth site(s) are removed to expose the growth site(s).

At 204, the substrate is inserted into the polymer growth chamber. The polymer source is connected to the polymer growth chamber. In an example, the polymer source includes a solid or liquid source of the polymer and is inserted into the growth chamber. In an example, the polymer source is in close vicinity to the substrate. In an example, the polymer source is positioned in a range of about 1-9 centimeters from the substrate. In an example, the polymer source is positioned within about 10 centimeters of the substrate. In an example, the polymer source is positioned within about one meter of the substrate.

At 205, the environment in the chamber is controlled to provide a fast growth of the polymer structures. The temperature of the chamber is controlled so that the carbon and oxygen are outgassed from the polymer source to the substrate. The temperature is less than 150 degrees C. in an example. The temperature is less than 100 degrees C. in an example. The pressure is at about one atmosphere. The polymer structures grow vertical initially on the growth sites and then on the prior grown polymer structure but not on the mask layer. These structures can be tubes with a width of 10 micrometers or less. In an example, the polymer structures have a width of less than 100 nanometers. The polymer structures grow at a rate of at least 80 micrometer per hour at the growth site.

The polymer source can be a rubber resin. The resin can be a solid, semi-solid or pseudo solid organic material with no definite melting point that can be comprised of high molecular weight material. In an example, the polymer source is an acrylate ester source. In an example, the polymer source supplies cyanoacrylates.

At 206, the mask is selectively removed from around the polymer structures. The mask is removed for further processing of the substrate with the polymer structures.

At 207, integrated circuit structures are fabricated using the polymer structures. Additional structures can be logic or memory circuits that use the polymer structures as a conductor. In an example, the additional structures can be logic or memory circuits that use the polymer structures as electrical insulators or thermal conductors. The addition structures can be micro, electro, mechanical systems (MEMS). In an example, the polymer structures are used in biological or pharmaceutical uses.

Figure 3:
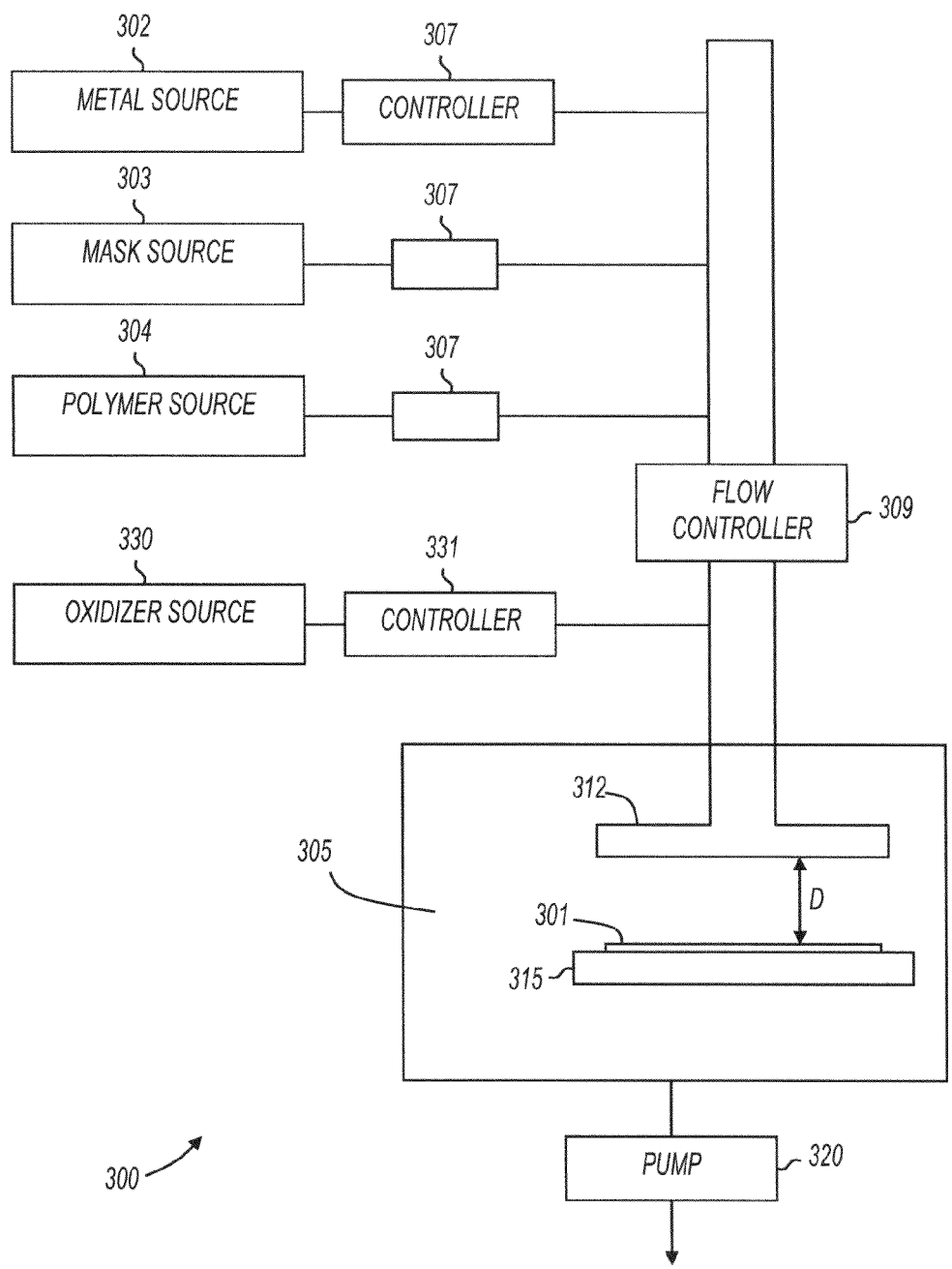
FIG. 3 shows a system in accordance with various embodiments of the present invention.

FIG. 3 illustrates an example of a deposition system 300 in accordance with various embodiments of the present invention. A substrate 301 on which deposition is to occur is placed in reaction or deposition chamber 305 of the deposition system 300. This chamber is adapted to grow the polymer structures at a rate of at least about 80 micrometer per hour at the growth site.

Any suitable deposition apparatus design may be used in the present invention, e.g., hot wall reactors, cold wall reactors, radiation beam-assisted reactors, plasma-assisted reactors, and the like. For example, the deposition processes described herein may be carried out in a chemical vapor deposition reactor, such as a reaction chamber available under the trade, designation of 7000 from Genus, Inc. (Sunnyvale, Calif.); a reaction chamber available under the trade designation of 5000 from Applied Materials, Inc. (Santa Clara, Calif.); or a reaction chamber available under the trade designation of Prism from Novelus, Inc. (San Jose, Calif.). However, any reaction chamber suitable for performing deposition may be used.

The deposition system 300 includes a metal source 302, a mask source 303, and a polymer source 304. Such sources are combined under control of flow controllers 307, which can be micro-pumps, to feed a master flow controller 309. An inert gas stream can also be provided to master flow controller 309 to assist flow of the source material to the downstream deposition chamber 305. A manifold 312 is in the chamber 305 and downstream of the sources 302-304 and master flow controller 309. A suitable substrate assembly holder 315, e.g., a wafer holder, is within chamber 305 with the substrate 301 thereon. The substrate holder 315 is generally aligned with the manifold 312. To control deposition onto the substrate 301, distance (D) between the manifold 312 and the substrate 301 can be varied. In an example, the substrate holder 315 can include an internal chuck heater. In use, the reaction chamber 305 and, more particularly, the substrate upon which deposition is to occur are maintained at a pre-selected temperature. In an example, the substrate is held at a low deposition temperature of less than about 250 degrees C. In a further example, the temperature is at less than 150 degrees C. In a further example, the temperature is at less than 125 degrees C. In a further example, the temperature is at less than 100 degrees C.

Preferably, the method for forming the polymer structures from polymer precursors is carried out with the polymer being a liquid or a solid at room temperature. In an example, the polymer precursor is a solid at room temperature or less than 100 degrees C. In an example, they can be use with flash vaporization, bubbling, microdroplet formation techniques, etc. However, they may also be sufficiently volatile that they can be vaporized or sublimed from the solid state. In an example, the polymer precursor can release a sufficient amount of the polymer material into the chamber 305 to grow polymer structures at a rate as discussed herein and at sufficient density to grow self supporting polymer structures.

In an example, the polymer source 304 holds a polymer as a solid that is exposed to the substrate 301 through the manifold 312. The polymer source may be physically located in the chamber 305. The polymer source can be a solid or liquid source that is positioned adjacent the substrate 301 in the chamber 305. The closer the source to the substrate will increase the density of polymer available to create the polymer structures. In an example, the polymer source sources an acrylate ester that provides carbon and oxygen to grow the polymer structures.

The deposition of the polymer structures is at atmospheric pressure or less. A vacuum pump 320 is in fluid communication with the deposition chamber 305 to control the pressure in the chamber. In an example, the deposition pressures during deposition of the metal layer, deposition of the mask layer, and growth of the polymer structures can be individually controlled by operation of the pump 320.

An oxidizer feed stream from oxidizer source 330 under control of flow controller 331 can be connected to the chamber 305 and is preferably provided upstream of the manifold 312. The oxidizer can provide additional oxygen to the growth sites.

Figure 4:
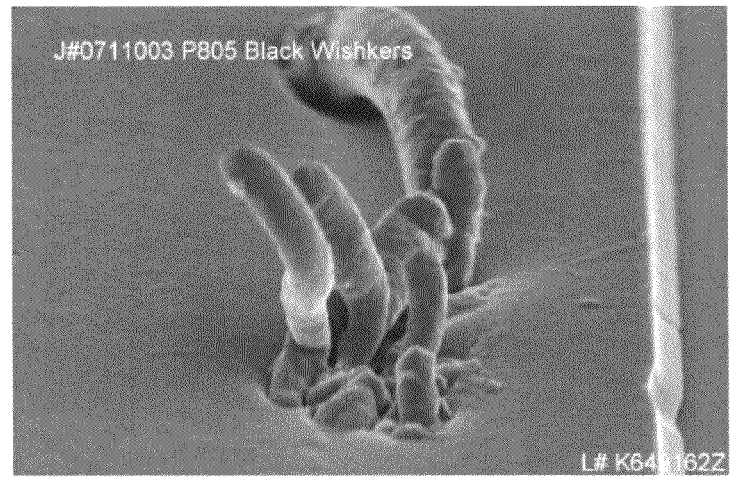
FIG. 4 shows a view of a polymer growth in accordance with various embodiments of the present invention.

FIG. 4 shows a view of the polymer structures as taken by a scanning electron microscope. In this example, the polymer structures are coated by aluminum protecting layer in this view. The polymer structures extend upwardly from the surface of the substrate.

Figure 5A:
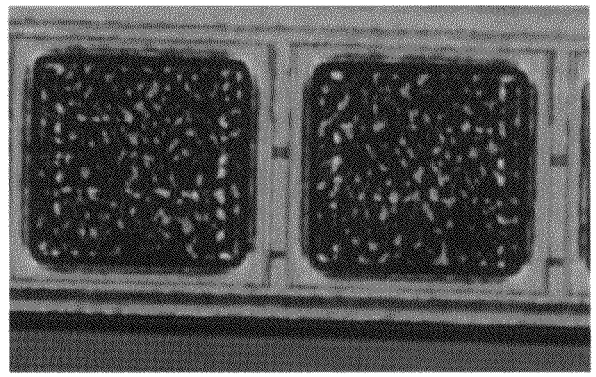
FIGS. 5A-5C shows view of a polymer growth in accordance with some embodiments.
Figure 5B:
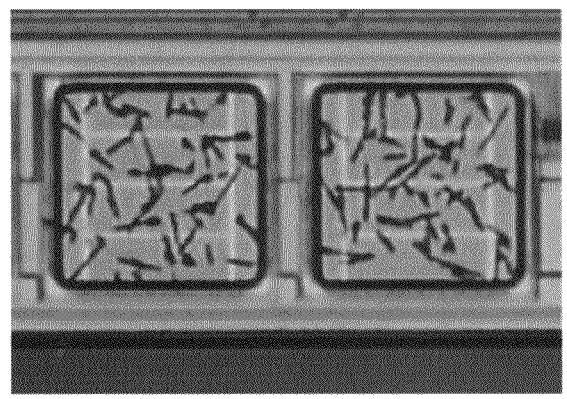
Figure 5C:
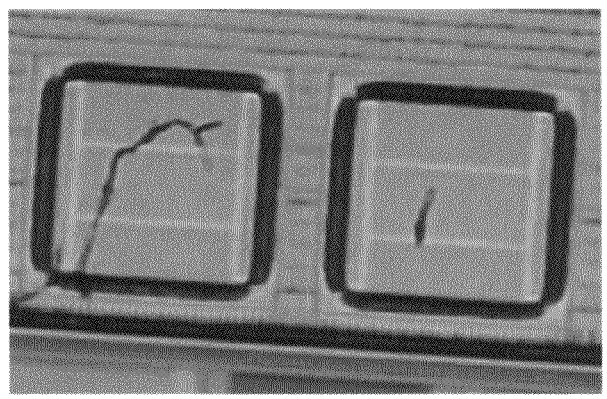

FIGS. 5A, 5B, and 5C show views of the polymer structures at different densities. The dark areas in these views are polymer structures. The density of the polymer structures can depend on availability of the reactive species from the polymer source. The availability of reactive species of the polymer is dependent on the quantity at the source and the environment of the chamber to deliver the reactive species to the surface of the substrate.

Figure 6:
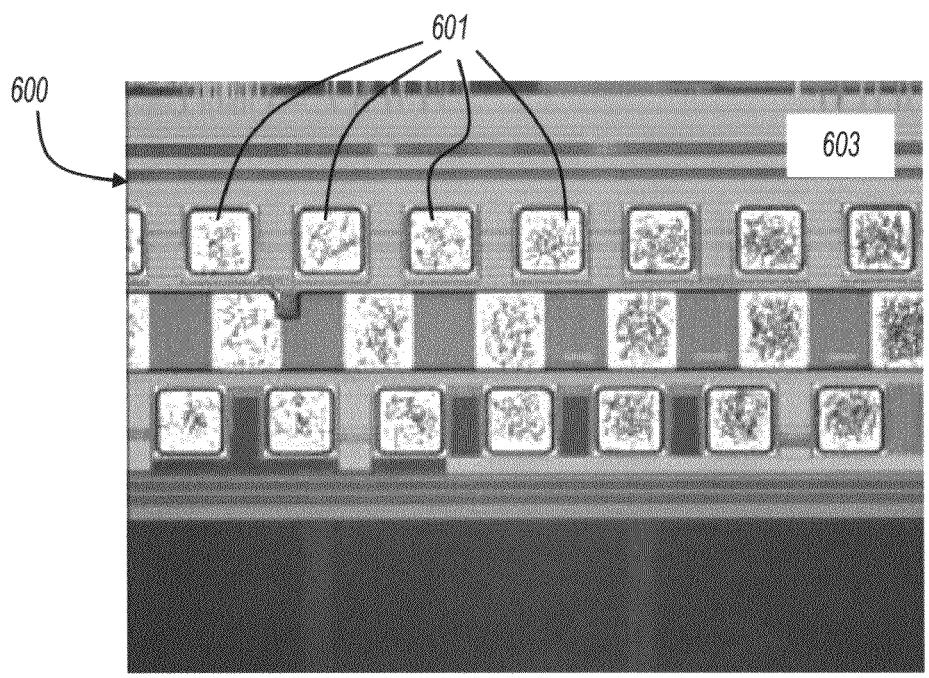
FIG. 6 shows a view of a polymer growth in accordance with various embodiments of the present invention.

FIG. 6 shows a view of substrate 600 whereon the polymer structures are only grown on the exposed growth sites 601 (such as exposed copper). The other areas are covered by a mask layer 603 (such as polyimide or silicon nitride). The darker areas in the growth sites 601 are the polymer structures (such as vertical tubes).

Figure 7:
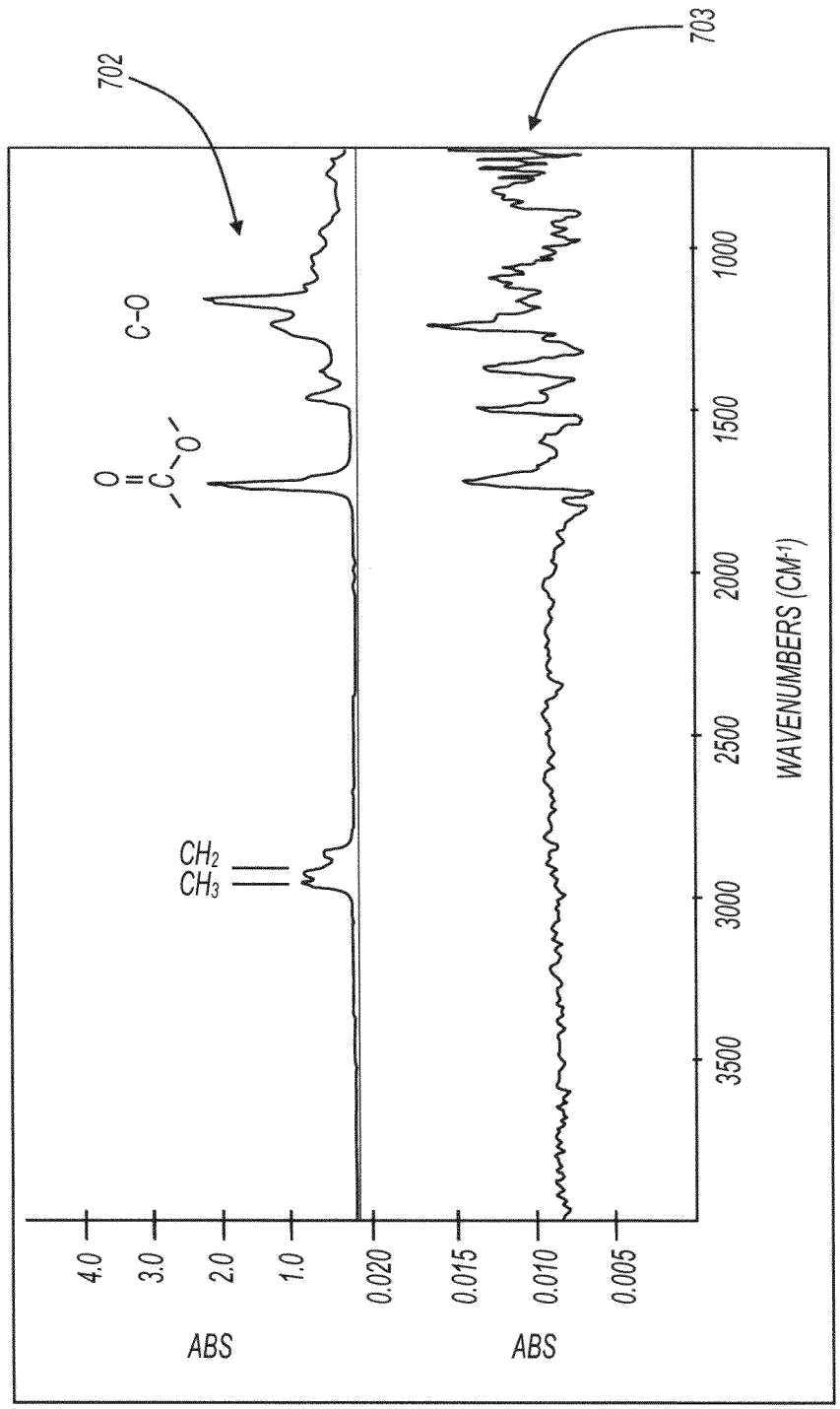
FIG. 7 shows a spectral analysis of a polymer source and a polymer structure in accordance with various embodiments of the present invention.

FIG. 7 shows a spectroscopy spectrum of the polymer source 702 and the resulting polymer structure 703. This spectrum was made by Fourier transform infrared (FTIR) spectroscopy. Polymer source spectrum 702 shows very intensive C═O signal at 1736 cm$^{-1}$ along with C—O peaks at 1236 cm$^{-1}$ and 1160 cm$^{-1}$. The polymer source further shows methylene C—H stretching vibrations at 2929 cm$^{-1}$ and 2859 cm$^{-1}$ and methyl C—H stretching vibrations at 2958 cm$^{-1}$ and 2873 cm$^{-1}$. In this example the polymer source is an acrylate ester. The polymer structure spectrum 703 shows peaks in the carbon and oxygen range. Specifically, the polymer structure spectrum 703 includes similar C═O and C—O peaks but is lacking the other peaks in the polymer source spectrum 702.

Figure 8:
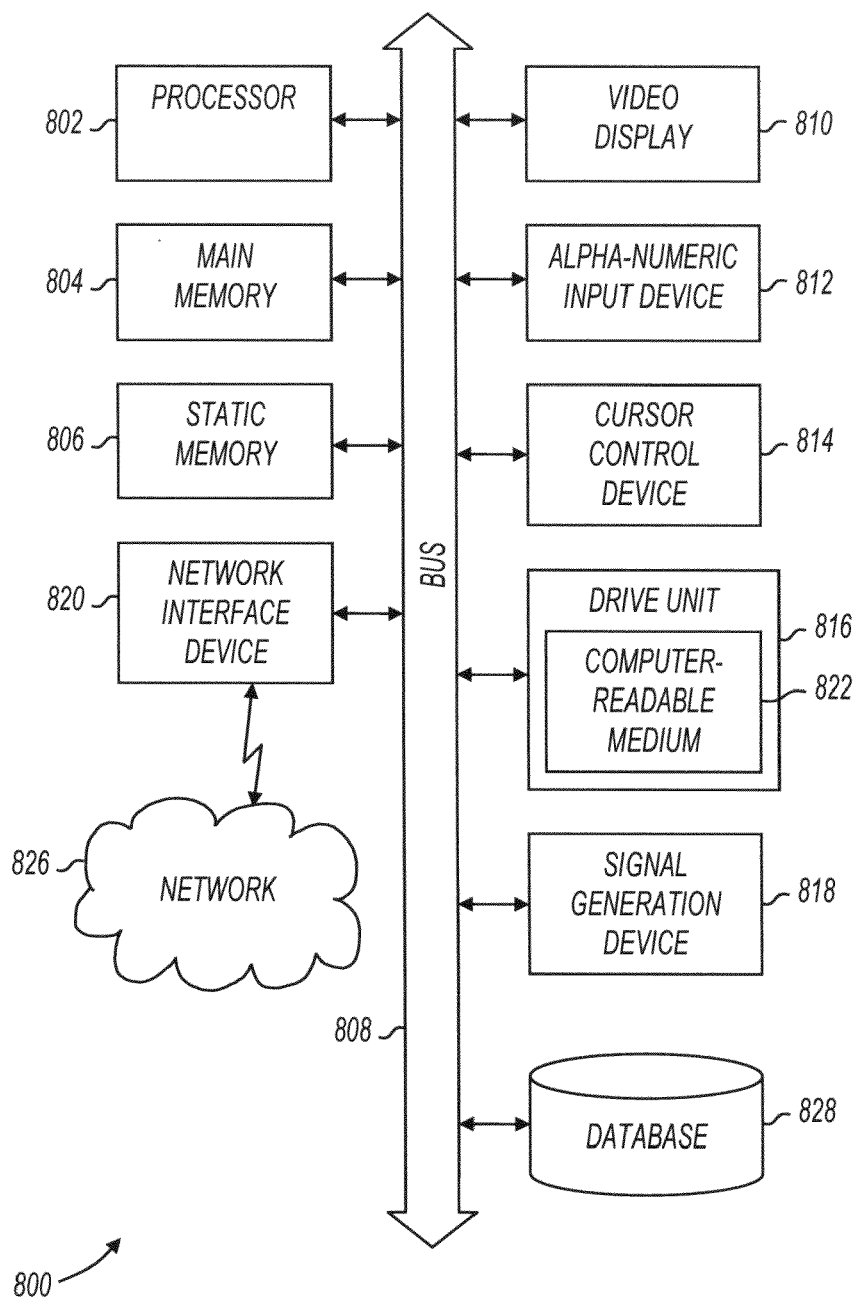
FIG. 8 shows an electronic device with a polymer structure in accordance with some embodiments.

FIG. 8 shows a diagrammatic representation of a machine in the example form of a computer system 800 within which a polymer structures as described herein can be used. The example computer system 800 includes a processor 802 (e.g., a central processing unit (CPU) a graphics processing unit (GPU) or both), a main memory 804 and a static memory 806, which communicate with each other via a bus 808. The computer system 800 may further include a video display unit 810 (e.g., a liquid crystal display (LCD) or a cathode ray tube (CRT)). The computer system 800 also includes an alphanumeric input device 812 (e.g., a keyboard), a cursor control device 814 (e.g., a mouse), a drive unit 816, a signal generation device 818 (e.g., a speaker) and a network interface device 820. The drive unit 816 includes a machine-readable medium 822. A database device 828 can be connected to the other components through the bus 808. Each of these elements 802-828 can include a polymer structure as described herein, within the associated circuitry for conducting electrical signals or within the mechanical structure to support mechanical components or as part of a thermal cooling system.

Embodiments of the present invention, which can include placing a solid substrate made of a matrix of various materials to create growth sites in close vicinity with a polymer source (which can resemble sticky tape) generates a very fast and selective growing (typical length of 80 micrometer in less than one hour) of polymeric structures. The polymer structures grow on part of the materials. i.e., at the growth sites, and not at other locations on the substrate. In one option the polymers are grown as thin and long tubes with a typical diameter at the nano scale. This method suggests a method for fast and controlled in space method to manufacture suitable structures for many polymer nanotube applications using micro and nano technology (including memories).

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. A method, comprising:
   providing a growth site on a substrate;
   exposing the growth site to a polymer source; and
   growing a polymer tube at a rate of at least 80 micrometer per hour at the growth site.

2. The method of claim 1, wherein growing a polymer tube includes growing polymer tubes with a diameter of less than one micrometer.

3. The method of claim 1, wherein growing a polymer tube includes controlling the length of the polymer tube by controlling exposure time to the polymer source.

4. The method of claim 1, wherein growing a polymer tube includes growing polymer tubes with a diameter at a nanometer scale.

5. The method of claim 1, wherein providing a growth site includes patterning copper on a solid semiconductor substrate.

6. The method of claim 5, wherein patterning copper includes uniformly coating a silicon wafer with a copper layer and forming a pattern layer to expose select portions of the copper layer.

7. The method of claim 6, wherein forming a pattern layer includes patterning using at least one of lithography and etching.

8. The method of claim 7, wherein forming a pattern layer includes forming a pattern layer of at least one of polyimide and silicon-nitride.

9. A method comprising:
   exposing a growth site to a polymer source at a temperature of less than 50 degrees Celsius; and
   growing a vertical polymer structure at a rate of at least 80 micrometer per hour at the growth site.

10. The method of claim 9, wherein growing a vertical polymer structure includes growing a polymer structure with a width of less than one micrometer.

11. The method of claim 9, wherein growing a vertical polymer structure includes controlling the length of the polymer tube by controlling exposure time to the polymer source.

12. The method of claim 9, wherein growing a vertical polymer structure includes growing a polymer tube with a diameter at a nanometer scale.

13. The method of claim 9, wherein exposing a growth site includes:
   patterning copper on a solid semiconductor substrate; and
   selectively exposing the copper to create growth sites.

14. The method of claim 13, wherein selectively exposing includes selectively coating the copper with at least one of polyimide and silicon-nitride.

15. The method of claim 9, wherein growing a vertical polymer structure includes controlling density of the polymer by controlling volume of a reactive species of the polymer.

* * * * *

UNITED STATES PATENT AND TRADEMARK OFFICE
CERTIFICATE OF CORRECTION

| | | |
|---|---|---|
| PATENT NO. | : 8,183,085 B2 | Page 1 of 1 |
| APPLICATION NO. | : 12/416094 | |
| DATED | : May 22, 2012 | |
| INVENTOR(S) | : Eyal Bar-sadeh et al. | |

It is certified that error appears in the above-identified patent and that said Letters Patent is hereby corrected as shown below:

On the cover page, item (75), in "Inventors", in column 1, line 5, delete "Bear" and insert -- Beer --, therefor.

Signed and Sealed this
Twenty-fourth Day of July, 2012

David J. Kappos
*Director of the United States Patent and Trademark Office*